United States Patent [19]
Jiang et al.

[11] Patent Number: 5,357,591
[45] Date of Patent: Oct. 18, 1994

[54] CYLINDRICAL-WAVE CONTROLLING, GENERATING AND GUIDING DEVICES

[76] Inventors: Yuan Jiang; Jill Hacker, both of 300 M St., SW., Rm. 708, Washington, D.C. 20024

[21] Appl. No.: 42,732

[22] Filed: Apr. 6, 1993

[51] Int. Cl.$^5$ .............................................. G02B 6/34
[52] U.S. Cl. ..................... 385/37; 385/130; 359/566; 359/569; 359/572; 359/574; 359/575
[58] Field of Search ............... 359/566, 569, 572, 574, 359/575; 385/27–31, 37, 130

[56] References Cited

U.S. PATENT DOCUMENTS

| | | | |
|---|---|---|---|
| 3,970,959 | 7/1976 | Wang et al. | 372/96 |
| 4,140,362 | 2/1979 | Tien | 359/19 |
| 4,743,083 | 5/1988 | Schimpe | 385/37 |
| 4,752,130 | 6/1988 | George et al. | 356/334 |
| 4,862,468 | 8/1989 | Fink | 342/19 |
| 4,897,844 | 1/1990 | Schimpe | 372/26 |
| 5,200,939 | 4/1993 | Nishiwaki et al. | 369/44.12 |
| 5,204,516 | 4/1993 | Opheij | 250/201.5 |

OTHER PUBLICATIONS

T. Erdogan, "Circular symmetric, distributed feedback structures for surface emitting semiconductor lasers," PhD thesis, University of Rochester, N.Y., 1992 (no month available).

T. Erdogan et al., "Circularly symmetric operation of a concentric-circle-grating, surface-emitting, AlGaAs/GaAs quantum-well semiconductor laser," Appl Phys Lett, 60(16), pp. 1921–1923, 20 Apr. 1992.

T. Erdogan et al., "Spatial modes of a concentric-circle-grating surface-emitting, AlGaAs/GaAs quantum well semiconductor laser," Appl Phys Lett, 60(15), pp. 1773–1775, 13 Apr. 1992.

T. Erdogan et al., "Circularly symmetric distributed feedback laser: Coupled mode treatment of TE vector fields," IEEE J. Quantum Electron., 28(3), pp. 612–623, Mar. 1992.

T. Erdogan et al., "Circularly symmetric distributed feedback semiconductor laser: An analysis," J. Appl. Phys., 68(4), pp. 1435–1444, 15 Aug. 1990.

M. Fallahi et al., "Electrically pumped circular-grating surface-emitting DBR laser on InGaAs strained single-quantum-well structure," IEEE Photon, Tech. Lett., 4(10), pp. 1087–1089, Oct. 1992.

C. M. Wu et al., "Electrically pumped circular-grating distributed-bragg-reflector lasers," IEEE Photon, Tech. Lett., 4(9), pp. 960–963, Sep. 1992.

C. M. Wu et al., "Room temperature operation of electically pumped surface-emitting circular grating DBR laser," Electron. Lett., 28(11), pp. 1037–1039, 21 May 1992.

C. M. Wu et al., "Optically pumped surface-emitting DGB GaInAsP/InP lasers with circular grating," Electron. Lett., 27(20), pp. 1819–1821, 26 Sep. 1991.

C. M. Wu et al., "Self-consistent coupled-wave theory for circular gratings on planar dielectric waveguides," IEEE J. Lightwave Technol., 9(10), pp. 1264–1277, Oct. 1991.

X. H. Zheng et al., "Mode coupling in circular-cylindrical system and its application to fingerprint resona- (List continued on next page.)

*Primary Examiner*—Frank Gonzalez

[57] ABSTRACT

Designs for cylindrical-wave controlling, generating and guiding devices are disclosed, which include multi-cylindrical-layer reflector and anti-reflection for unguided cylindrical waves, and concentric-circle-grating waveguide reflector, directional coupler and distributed feedback structures for guided cylindrical waves. A multi-cylindrical-layer structure takes the form of cylindrical layers wrapped concentrically around a central rod. A grating waveguide structure takes the form of a slab waveguide in which one of the slabs has circular ridge-groove grating. Layer and ridge-groove spacings are critical to the functionality of these structures. Design rules are outlined. These structures are important components for cylindrical wave controls. Designs of narrow-linewidth and high-power surface-emitting semiconductor lasers using the grating reflectors and 90-degree couplers are also disclosed.

12 Claims, 10 Drawing Sheets

OTHER PUBLICATIONS tors," IEEE J. Lightwave Technol., 8(10), pp. 1509–1516, Oct. 1990.

X. H. Zheng et al., "Theory of two-dimensional 'fingerprint' resonators," Electron. Lett., 25(19), pp. 1311–1312, 14 Sep. 1989.

X. M. Gong et al., "Lateral mode discrimination in surface emitting DBR lasers with cylindrical symmetry," SPIE Laser Diode Technol. Appl. III, vol. 1418, pp. 422–433, 1991 (no month available).

A. S. Sudbo et al., "Reflectivity of integrated optical filters based on elliptic bragg reflectors," IEEE J. Lightwave Technol., 8(6), pp. 998–1006, Jun. 1990.

V. A. Kisilev et al., "Wide-aperture focusing in the case of excitation of an optical waveguide through an annular grating," Sov. Phys. Tech. Phys., 33(8), pp. 987–989, Aug. 1988.

S. R. Kerner et al., "On the theory of corrugated optical disk waveguides," IEEE Trans. Microwave Theory Tech., vol. MTT-28, No. 1, pp. 18–24, Jan. 1980.

N. G. Alexopoulos et al., "Coupled power theorem and orthogonality relations for optical disk waveguides," J. Opt. Soc. Am., 67(12), pp. 1634–1638, Dec. 1977.

M. Toda, "Single-mode behavior of a circular grating for potential disk-shaped DFB lasers," IEEE J. Quantum Electron., 26(3), pp. 473–481, Mar. 1990.

P. K. Tien, "Method of forming novel curved-line gratings and their use as reflectors and resonators in integrated optics," Optics Letters, 1(2), pp. 64–66, Aug. 1977.

K. M. Dzurko et al., "1-W single-mode edge-emitting DBR ring oscillators," IEEE Phot. Tech. Lett., 4(4), pp. 369–371, Apr. 1993.

K. M. Dzurko et al., "500mW coherent large aperture ring oscillators," Electronics Letters, 28(16), pp. 1477–1478, 30 Jul. 1992.

K. M. Dzurko et al., "Single mode broad area distributed bragg reflector ring oscillators," Appl. Phys. Lett., 61(20), pp. 2389–2391, 16 Nov. 1992.

A. Hardy et al., "Design considerations of large aperture perpendicular gratings semiconductor ring lasers," Appl. Phys. Lett., 62(9), pp. 931–933, 1 Mar. 1993.

M. Toda, "Proposed cross grating single-mode DFB laser," IEEE J. Quantum Elect., 28(7), pp. 1653–1662, Jul. 1992.

M. Born et al., Principles of Optics, 3rd Ed. (Pergamon, New York, 1965) (no month available).

CYLINDRICAL-WAVE CONTROLLING, GENERATING AND GUIDING DEVICES

BACKGROUND OF THE INVENTION

1. Field of the Invention

The present invention relates to devices for controlling, generating and guiding waves. The waves can be electromagnetic waves, acoustic waves, and the like. Such a device comprises at least two adjacent media with a cylindrical interface or a disk-like thin-film waveguide with at least one ridge and one groove on one of the thin films. One of the media can be air or vacuum. The device may take the form of a multi-cylindrical-layer wrapped rod, or a disk-like slab-waveguide (thin film) structure with circular ridge-groove grating in one of the slabs. The cylindrical-layer and grating-step spacings are critical in designing the devices.

2. Description of the Prior Art

About a hundred years ago, it was observed that a periodic crystal lattice structure can reflect X rays. W. L. Bragg was the first to propose a reasonable explanation for this phenomenon. Since then, plane (one-dimensional) periodic structures, constructed by alternating plane dielectric layers (sheets), have been used as high-reflection coatings for optical components and devices and as mirrors for optical waves in narrow-bandwidth filters, vertical-cavity surface-emitting semiconductor lasers (VCSELs) and many other applications. Such structures are often called distributed-Bragg reflectors (DBRs) or multi-stack dielectric mirrors and are among the most important building blocks for wave generation and control devices.

Altered forms of such structures, taking the form of corrugated gratings in waveguides, are applied to guided optical waves. They are used in semiconductor DBR lasers, quarter-wavelength-shifted distributed-feedback (DFB) lasers, waveguide filters and other guided-wave devices. The ridges and grooves of the gratings induce periodic changes in the effective index of the waveguides, and thus function as distributed reflectors to the guided waves.

The layer spacings of DBRs are usually odd-integer multiple of a quarter of the designated wavelength. Multi-layer structures, with spacings of odd and even multiples of a quarter wavelength, have found other uses, for example anti-reflection coatings for optical components and devices. The guided wave versions of such structures, with gratings to create the alternating changes in effective index, have been found to function as directional couplers that couple optical waves out of waveguides.

Another use of the periodic grating structures, mostly used in DFB lasers, takes advantage of the guided wave modes that experience equal forward and backward reflectivities from the gratings. DFB lasers (with or without quarter-wavelength shifting) and DBR lasers are the most important semiconductor lasers that can achieve narrow linewidths, or high spectral purity in other words.

DBR and DFB lasers are used widely in telecommunication and cable TV distribution systems. VCSELs are important for optical interconnect applications. High-reflection and anti-reflection coatings are usually used in optical components and devices which contain media interfaces.

There have been many efforts to construct cylindrical (two-dimensional) versions of DBR, anti-reflective, directional coupler and DFB structures for cylindrical wave devices. Most of these efforts are direct extensions of the one-directional versions. The following typical references represent the large body of the prior art.

[1.] U.S. Pat. No. 4,743,083 to R. M. Shimpe, "Cylindrical diffraction grating couplers and distributed feedback resonators for guided wave devices," May 10, 1988.

[2.] T. Erdogan and D. G. Hall, "Circularly symmetric operation of a concentric-circle-grating, surface-emitting, AlGaAs/GaAs quantum-well semiconductor laser," *Appl. Phys. Lett.*, vol. 60, pp. 1921–1923, 1992.

[3.] T. Erdogan, Circular symmetric, distributed feedback structures for surface emitting semiconductor lasers, PhD thesis, 1992.

[4.] M. Fallahi, F. Chatenoud, I. M. Templeton, M. Dion, C. M. Wu, A. Delage, and R. Barber, "Electrically pumped circular-grating surface-emitting DBR laser on InGaAs strained single-quantum-well structure," *IEEE Photon Tech. Lett.*, vol. 9, pp. 1087–1089, 1992.

[5.] M. Toda, "Single-mode behavior of a circular grating for potential disk-like DFB lasers," *IEEE J. Quantum. Electron.*, vol. 26, pp. 473–481, 1990.

[6.] U.S. Pat. No. 4,140,362 to P. K. Tien, "Forming focusing diffraction gratings for integrated optics," 1976.

[7.] U.S. Pat. No. 3,970,959 to S. Wang, "Two dimensional distributed feedback devices and lasers," 1976.

8.] H. Kogelnik and C. V. Shank, "Double-heterostructure GaAs distributed-feedback laser," *Appl. Phys. Lett.*, vol. 25, pp. 200–201, 1974.

9.] W. L. Bragg, Proc. Cambridge Phil. Soc., vol. 17, p. 43, 1913.

10.] M. Born and E. Wolf, Principles of Optics, 3rd Ed. (Pergamon, N.Y. 1965).

11.] M. J. Adams, *An Introduction to Optical Waveguides,* (John Wiley and Sons, Chichester, 1981), Ch. 7.

U.S. Pat. No. 4,743,083 to R. M. Shimpe discloses designs of cylindrical diffraction grating couplers and distributed reflectors for guided wave devices. These designs use periodic concentric gratings to control cylindrical waves, in much the same way as one-dimensional gratings to plane waves. A major part of our inventions—distributed reflectors and couplers—improves on Shimpe's designs in using non-periodic structures spaced according to specific rules.

T. Erdogan et al. achieved the first optically-pumped surface-emitting semiconductor laser using a periodical grating design. Ref. [2] and [3] show their best results in detail. Ref. [4] demonstrated one of the first electrically-pumped surface-emitting laser using periodic gratings. These references describe in detail how these lasers are constructed. They also discuss the potential use of these devices for high-power laser sources.

Ref. [5] proposes a design that places the grating steps at their roots of Bessel/functions, the nodes of the standing waves. However, it does not take into account of the waves' phase changes at the ridge-groove-step interlaces.

U.S. Pat. No. 4,140,362 to P. K. Tien discloses techniques for producing periodically spaced curved gratings to couple and focus optical waves from waveguides.

U.S. Pat. No. 3,970,959 to S. Wang et al. describes the use of two series of straight line (one-dimensional) gratings to reflect guided light waves and to couple light into and out of waveguides.

Kogelnik et al. describe how one-dimensional DFB lasers can achieve narrow linewidth. The paper by W. L. Bragg explains how periodic structures reflect X rays.

The book by Born et al. teaches how multi-stack DBRs and anti-reflective layers can be constructed and used. It and the book by Adams are excellent textbooks for analyzing optical wave devices.

However, all prior designs of cylindrical wave controls fail to perform well because their grating spacings do not match well with the phases of the cylindrical waves. For instance, surface-emitting semiconductor lasers with periodic grating cylindrical DBR and DFB structures, demonstrated in Refs. [2] and [3], have yielded spectra tar from pure; and the optical-power distributions in the structures are far from what are desired for practical uses.

For these structures, the grating-step spacing design is critical. The spacings affect the phases of the transmitted, reflected and diffracted waves at medium interfaces, and control the amounts of these waves. The behavior of cylindrical waves are more complex than that of plane waves. Most of the prior designs simply adopt the argument that is used for plane waves and assume that phases of cylindrical waves change 90 degrees at every quarter wavelength; but in fact cylindrical waves are not periodic in the radial direction.

Only one prior design (Ref. [5]) improves on the periodic design and argues that phases of cylindrical waves change at the roots of Bessel functions; however, cylindrical-wave phase changes at media inter/aces are not counted in this argument.

Our invention takes into account both the wave-propagation phase change and the phase change at media interfaces. With this accurate method for controlling the wave phases, we design cylindrical-wave controlling devices and elements for wave-controlling, generating and guiding devices. Our invention improves on the designs in U.S. Pat. No. 4,743,083 and other prior designs. We outline specific design rules for determinating the grating-step spacings. In addition, our invention extends the underlying principles to the design of other wave-control devices and to the design of semiconductor lasers of narrow linewidth and high power. The principles apply to both guided cylindrical waves and unguided (conventional) waves.

SUMMARY OF THE INVENTION

The present invention provides devices to control cylindrical waves accurately. Some of these devices are, further, used as parts of devices for controlling, generating and guiding cylindrical waves. A cylindrical-wave controlling device includes at least two adjacent media or two adjacent pieces of a waveguide with a cylindrical interface. One of the media can be air or vacuum. Such a device may take the form of cylindrical layers wrapped concentrically around a central rod, or a stacked-disk thin-film waveguide structure with concentric-circle ridge-groove grating in one of the disk-like thin films.

Cylindrical waves are subject to phase changes while propagating and when striking the interface of the two media or two pieces of a waveguide. The spacings of the cylindrical layers or ridge-groove grating control the phases and amplitudes of these waves and, therefore, control these waves.

One object of the present invention is to provide designs for distributed reflectors in the form of multi-cylindrical-layer structures or grating waveguides. Spacings of the cylindrical layers or ridge-groove grating are selected so that the reflections of a cylindrical wave are in phase with the original wave and so that the combined reflection is maximized.

Another object is to provide designs for anti-reflection cylindrical-layer structures for cylindrical waves. Spacings of the cylindrical layers are selected so that the reflections of a cylindrical wave are, alternatingly, out of phase and in phase with the original wave and so that the combined reflection is minimized.

Another object is to provide designs for grating waveguide Couplers which redirect guided cylindrical waves to the free space for output and couple waves shone on the waveguides from free space into the waveguide. Spacings of the grating are selected so that the diffractions, at an angle to the radial directions, of a cylindrical wave are in phase with the original wave and so that the combined reflection is maximized.

Another object is to provide designs for distributed-feedback grating waveguide structures for cylindrical waves. Spacings of the grating are selected so that the reflections of outgoing and incoming cylindrical waves are equal.

Another object is to use the above apparatus as components to provide design low-threshold-current vertical-cavity lasers, narrow-linewidth surface-emitting semiconductor lasers and high-power surface-emitting semiconductor lasers.

DESCRIPTION OF THE PREFERRED EMBODIMENTS

Cylindrical waves propagate in a cylindrically symmetric medium. By definition, cylindrical symmetry refers to the invariance property of an object when it is rotated around an axis, in this case the z axis.

Figure 1:
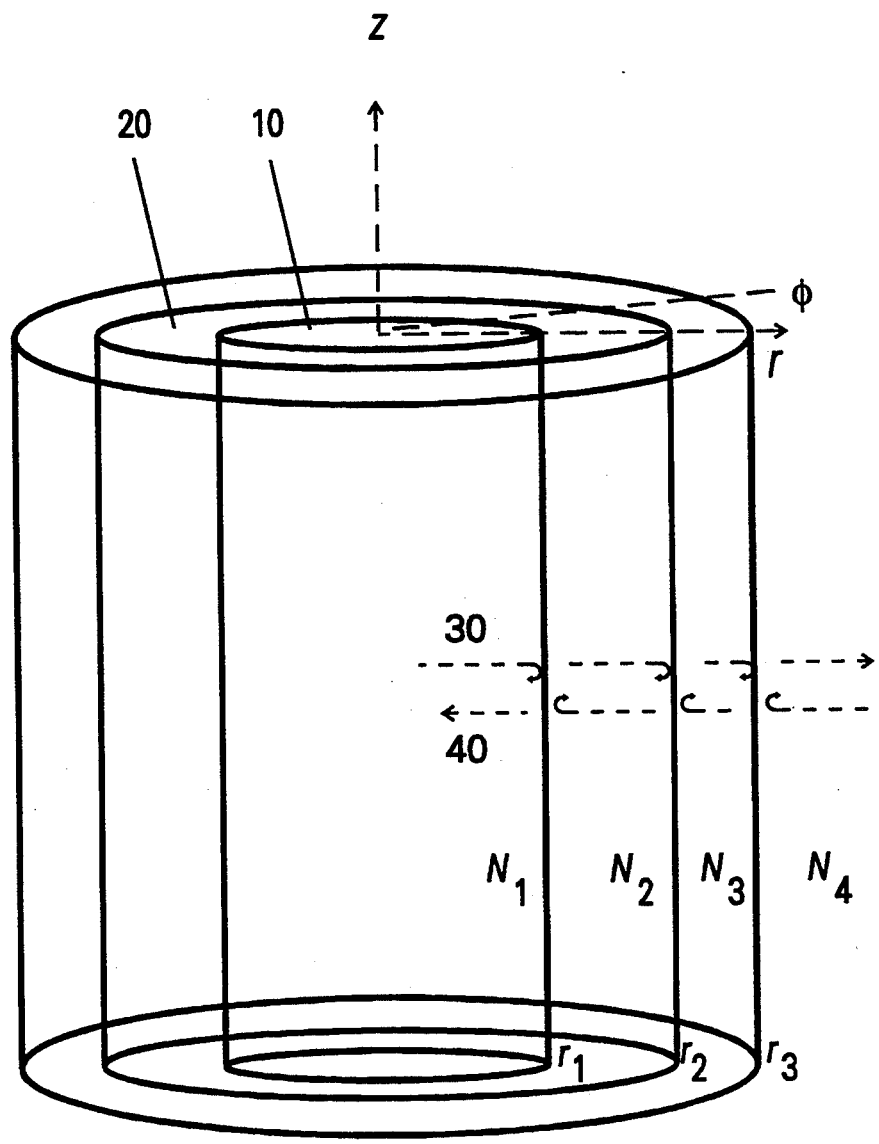
FIG. 1 shows a multi-cylindrical-layer structure. Each cylindrical layer has a different refractive index, so that cylindrical waves are partially reflected and partially transmitted at each interface. This is the basic structure for all multi-cylindrical-layer structures.
Figure 2:
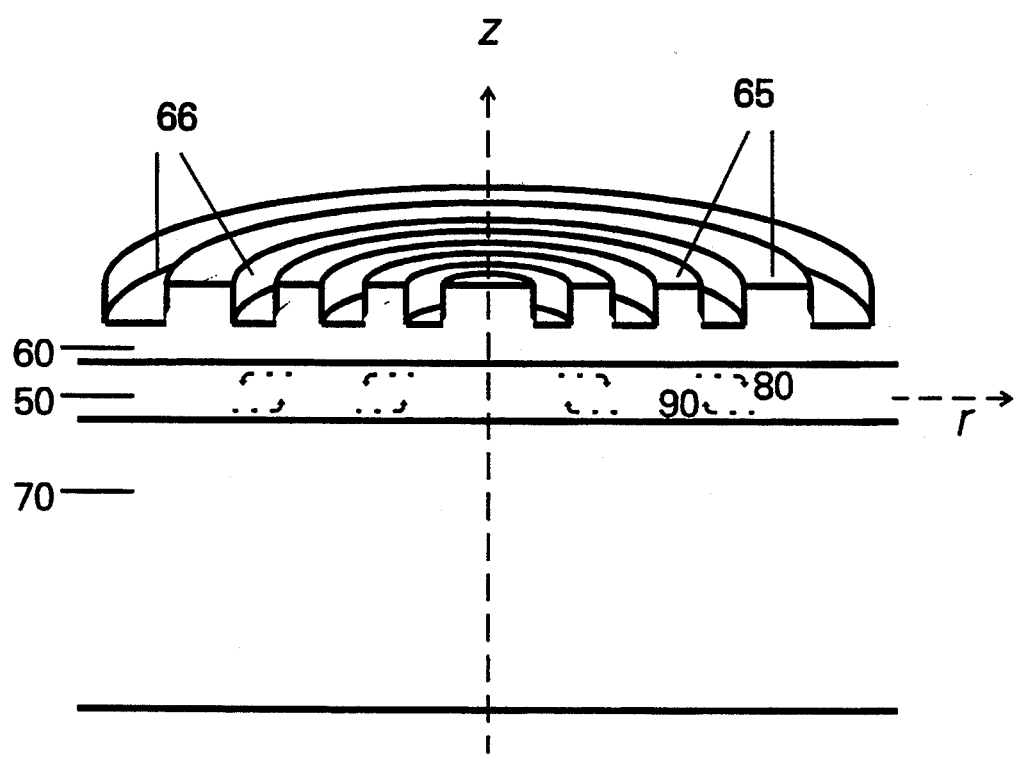
FIG. 2 is a partly cross-sectional and partly representational diagram of a grating slab-waveguide structure. The middle slab 50 has a higher refractive index than do the top and bottom slabs. The top slab is shown to have a circular ridge-groove grating. Guided cylindrical waves experience effective-refractive-index changes at the ridge-groove interfaces of the grating and, therefore, are partially reflected, partially diffracted and partially transmitted there. This is the basic structure for all multi-cylindrical-layer structures.

FIGS. 1 and 2 show two cylindrically symmetric structures, the basic structures of concern to this invention for cylindrical wave controls. Cylindrical Waves take different forms—conventional and guided cylindrical waves respectively—in these two structures. Each invented wave control structure may have two versions, one for conventional (unguided) waves and the other for guided waves.

FIG. 1 shows a multi-cylindrical-layer structure. In these layers, waves propagate at different speeds, which are characterized by the refractive indices $N_1, N_2, N_3, N_4, \ldots$ of the layer media: if one of the layer media is air or vacuum, its refractive index is one. Therefore, when waves strike the interfaces at $r_1, r_2, r_3, \ldots$ they are partially reflected and partially transmitted. This is the basic structure for all multi-cylindrical-layer structures. In it, cylindrical waves can propagate not only along the radial directions, but also along the z direction—the wavevectors can have both radial and z components. Such waves may be called conventional or unguided cylindrical waves.

FIG. 2 shows a circular grating waveguide structure. It is a disk-like sandwiched slab structure. The middle slab 50 has a higher refractive index than that of the top (60) and bottom (70) slabs. Thus, the guided cylindrical waves are confined (guided) in the vicinity of the middle slab and can propagate only in the radial direction. In general, more than three slabs may be used in such a structure. If one of the slabs has embedded circular gratings, as does the top slab 60 in FIG. 2, the guided cylindrical waves experience different effective refractive indices in the grating ridges (65) and grooves (66). Therefore, the waves are partially reflected, partially diffracted and partially transmitted at each ridge-groove interface (step). Although different in the z direction, the radial propagation of conventional (unguided) and guided cylindrical waves is based on similar wave equations and can be analyzed with the same principles.

Regulating the proportions of reflection, diffraction and transmission at the interfaces lies at the heart of all the wave-controlling devices in this invention. Layer and grating-step spacings are critical in determining these proportions. Below we provide a detailed analysis that is more accurate than those used in the prior art.

A. Waves in a Cylindrically Symmetric and Radially Homogeneous Medium and Slab Waveguide We first consider the electromagnetic fields in each cylindrical layer, a cylindrically symmetric dielectric medium that is homogeneous in the z and r directions. The electromagnetic fields ($\vec{E}$, $\vec{H}$) satisfy the Maxwell equations $$\nabla \times \vec{H} = \epsilon \frac{d\vec{E}}{dt}, \quad \nabla \times \vec{E} = -\mu_0 \frac{d\vec{H}}{dt}. \quad (1)$$

Here $\epsilon$ is the dielectric constant and $\mu_0$ is the vacuum permeability. The fields of the cylindrical waves with angular frequency $\omega$ are sums of eigenwaves, and can be expressed in cylindrical coordinates as $$\vec{E} = \sum_{u,m} \vec{E}_{u,m}(r) e^{im\phi} e^{i\beta z} e^{-i\omega t}, \quad \vec{H} = \sum_{u,m} \vec{H}_{u,m}(r) e^{im\phi} e^{i\beta z} e^{-i\omega t}, \quad (2)$$

where u is the wave vector in the radial direction, $m (=0, \pm 1, \pm 2, \ldots)$ is the index of the azimuthal mode, $\beta = \sqrt{(N\omega/c)^2 - u^2}$ is the wave constant in the z direction, and $N = \sqrt{\epsilon}$ is the index of refraction. The angular frequency is $2\pi$ times the frequency f of the wave. The radial wavelength may be defined as $\pi_r = 2\pi/u$.

In a disk-like slab-waveguide structure, the waves are confined in the z direction toward the middle slabs, which have higher refractive indices than the outside slabs. The structure is not homogeneous in the z direction, and N is a function of z. However, the fields, having the same u and m but different $\beta$ in each slab, may be written similarly to Eq. (2)

$$\vec{E} = \sum_{u,m} \vec{E}_{u,m}(r) e^{im\phi} f_u(z) e^{-i\omega t}, \quad \vec{H} = \sum_{u,m} \vec{H}_{u,m}(r) e^{im\phi} f_u(z) e^{-i\omega t}, \quad (3)$$

where the waveguide mode function f(z) in the z direction is determined by the particular waveguide structure. Therefore, the r dependence of the fields $\vec{H}_{u,m}(r)$ and $\vec{H}_{u,m}(r)$ in Eqs. (2) and (3) is governed by similar equations for structures with and without waveguidings.

In these structures, each eigenwave may be excited individually. Below, we concentrate on only the radial propagation ($\vec{E}_{u,m}(r), \vec{H}_{u,m}(r)$) of an eigenwave. For visual clarity, we drop their subscripts (u,m) in the following equations. From Eqs. (1), their vector components can be written as $$E_z(r) = E_0[e^{(1)} H_m^{(1)}(ur) + e^{(2)} H_m^{(2)}(ur)], \quad (4)$$

$$H_z(r) = \frac{i}{c\mu_0} E_0[h^{(1)} H_m^{(1)}(ur) + h^{(2)} H_m^{(2)}(ur)],$$

$$E_r(r) = -\frac{1}{u^2} \left( \frac{m\omega\mu_0}{r} H_z - i\beta \frac{dE_z}{dr} \right),$$

$$E_\phi(r) = -\frac{1}{u^2} \left( i\omega\mu_0 \frac{dH_z}{dr} + \frac{m\beta}{r} E_z \right),$$

$$H_r(r) = \frac{1}{u^2} \left( i\beta \frac{dH_z}{dr} + \frac{m\omega N^2 \epsilon_0}{r} E_z \right),$$

$$H_\phi(r) = \frac{1}{u^2} \left( -\frac{m\beta}{r} H_z + i\omega N^2 \epsilon_0 \frac{dE_z}{dr} \right),$$

Here, $H_m^{(1)}$ and $H_m^{(2)}$ are mth order Bessel functions of the third kind (also known as Hankel functions) and $E_0$ is a normalization factor chosen so that the coefficients $e^{(1)}$, $e^{(2)}$, $h^{(1)}$ and $h^{(2)}$ representing the field strengths are dimensionless. $H_m^{(1)}$ represents an outgoing wave and $H_m^{(2)}$ represents an incoming wave. An outgoing wave, such as 30 in FIG. 1 and 80 in FIG. 2, propagates away from the central z axis, whereas, incoming wave, such as 40 in FIG. 1 and 90 in FIG. 2, propagates toward the central z axis.

If the region contains the z axis ($r = r_0 = 0$), the solutions corresponding to $h^{(1)} = h^{(2)} = 1/\sqrt{2}$ are the only physically meaningful ones. That is, an incoming wave emerges as the outgoing wave after passing through the center. This is a major difference between a cylindrical wave and a plane wave.

B. Wave Reflections and Diffractions at Interfaces of Cylindrical Layers and Waveguides In this section, we discuss how waves are reflected and transmitted at interfaces of homogeneous dielectric media or slab waveguides with cylindrical symmetry. For a structure that is homogeneous in the z direction, such as the multi-cylindrical-layer structure shown in FIG. 1, the eigenwaves stay decoupled across the interfaces. In other words, when an outgoing wave $H_m^{(1)}$ of radial wave constant u strikes a cylindrical interface, only waves $H_m^{(2)}$ and $H_m^{(1)}$ with the same radial wave constant are reflected and transmitted, respectively.

For guided-wave structures such as the grating waveguide structure in FIG. 2, a ridge region and a groove region may be considered to be two different waveguides because waves propagate at different speeds in them. The eigenwaves are coupled across the ridge-groove interfaces. However, the effective index approximation, which assumes the couplings among waves of different u are small and can be neglected, has been found accurate for many guided-wave device structures and is widely used in device analysis. We may adopt such an approximation with confidence for the following guided-wave-structure analysis. Under this approximation, the equations relating the guided-wave fields across the ridge-groove interfaces are the same as those for conventional (unguided) cylindrical waves. The guided-wave propagation in the radial direction is characterized by its effective refractive index.

Suppose two concentric cylindrically symmetric layers with refractive indices $N_1$ and $N_2$ (or two concentric cylindrical slab-waveguide structures with effective refractive indices $N_1$ and $N_2$) meet at $r_1$. The tangential components of the fields $E_z$, $H_z$, $E_\phi$ and $H_\phi$ are continuous. The continuation conditions can be written in the form of vector equations $M_1(r_1) f_1 = M_2(r_1) f_2$, where $$M_i(r_1) = \begin{pmatrix} H_n^{(1)}(u_i r_1) & H_n^{(2)}(u_i r_1) & 0 & 0 \\ 0 & 0 & H_n^{(1)}(u_i r_1) & H_n^{(2)}(u_i r_1) \\ \frac{mc\beta}{\omega u_i^2 r_1} H_n^{(1)}(u_i r_1) & \frac{mc\beta}{\omega u_i^2 r_1} H_n^{(2)}(u_i r_1) & \frac{1}{u_i^2} \frac{dH_n^{(1)}(u_i r_1)}{dr} & \frac{1}{u_i^2} \frac{dH_n^{(2)}(u_i r_1)}{dr} \\ \left(\frac{N_i}{u_i}\right)^2 \frac{dH_n^{(1)}(u_i r_1)}{dr} & \left(\frac{N_i}{u_i}\right)^2 \frac{dH_n^{(2)}(u_i r_1)}{dr} & \frac{mc\beta}{\omega u_i^2 r_1} H_n^{(1)}(u_i r_1) & \frac{mc\beta}{\omega u_i^2 r_1} H_n^{(2)}(u_i r_1) \end{pmatrix}, \text{ and } f_i = \begin{pmatrix} e_i^{(1)} \\ e_i^{(2)} \\ h_i^{(1)} \\ h_i^{(2)} \end{pmatrix}, \quad (6)$$

where $u_1$ and $u_2$ represent the radial wave constants in the respective media. This can be reduced to $$f_2 = [M_2(r_1)]^{-1} M_1(r_1) f_1 = P_{2,1}(r_1) f_1, \quad (7)$$

where $$P_{2,1}(r_1) = [M_2(r_1)]^{-1} M_1(r_1) \quad (8)$$

For a structure of many cylindrical layers (grating waveguides) with interfaces at $r_1, r_2, \ldots$, we have $$f_{n+1} = P_{n+1,n}(r_n) \ldots P_{2,1}(r_1) f_1 = Q_n f_1, \text{ where}$$
$$Q_n = P_{n+1,n}(r_n) \ldots P_{2,1}(r_1), \; n = 2, 3, \quad (9)$$

For such a multi-layer (grating waveguide) structure, we can define $$I = |e^{(1)}|^2 + |e^{(2)}|^2 + \frac{\omega}{uc}(|h^{(1)}|^2 + |h^{(2)}|^2) \quad (10)$$

as an indicator of the normalized optical intensity in the cylindrical layer (region). Decreases and increases of $1/r^2$ in outgoing and incoming cylindrical wave intensities are precluded in this definition.

If the multi-layer structure is a resonator and some of the cylindrical layers (ridges and grooves) provide gain, the normalized gain is proportional to the integration of the normalized field intensity in these layers (ridges and grooves)

$$G = \frac{\sum_{\text{active region } i} I_i \cdot (r_i - r_{i-1})}{\sum_{\text{all region } i} I_i \cdot (r_i - r_{i-1})}, \text{ define } r_0 = 0. \quad (11)$$

Here, the radius of the innermost rod (ridge or groove) is defined as the first layer (step) spacing. The normalized gain is an indicator of how waves are concentrated in the designated cylindrical layers or regions.

Note the use of propagating wave representations in the above equations; we may also use standing wave representations in terms of Bessel functions $J_m$ and $Y_m$, which are real functions and convenient for numerical calculations. However, the physical meanings of $H_m^{(1)}$ and $H_m^{(2)}$ are more obvious. Nevertheless $H_m^{(1)}$ and $H_m^{(2)}$ relate to $J_m$ and $Y_m$ by an orthogonal transform, $$H_m^{(1)} = J_m + iY_m, \; H_m^{(2)} = J_m - iY_m. \quad (12)$$

Therefore, the matrices corresponding to M, P and Q for standing waves are similarity transformations of those for the propagating waves shown above. The normalized intensity for the standing wave representation takes the same form.

When $\beta = 0$ (waves propagating radially) or $m = 0$ (waves of zeroth azimuthal order), the matrices M, P and Q are decoupled into $2 \times 2$ matrices, and the waves can be separated into TE and TM waves. Specifically, for the TE waves of mth azimuthal order $$H_z(r) = \frac{i}{c\mu_0} E_0 (h^{(1)} H_m^{(1)}(ur) + h^{(2)} H_m^{(2)}(ur)), \quad (13)$$

$$E_\phi(r) = \frac{\omega}{c} E_0 \frac{1}{u^2} \left( h^{(1)} \frac{dH_m^{(1)}(ur)}{dr} + h^{(2)} \frac{dH_m^{(2)}(ur)}{dr} \right),$$

-continued $$H_\phi, E_r \propto \frac{1}{r} H_z, H_r \propto E_\phi, \text{ and } E_z = 0.$$

The decoupled 2×2 matrices M, P and Q for these TE waves can be derived from Eqs. (5–9). For example, $$M_i(r_i) = \begin{pmatrix} H_m^{(1)}(u_i r_i) & H_m^{(2)}(u_i r_i) \\ \frac{1}{u_i^2} \frac{dH_m^{(1)}(u_i r_i)}{dr} & \frac{1}{u_i^2} \frac{dH_m^{(2)}(u_i r_i)}{dr} \end{pmatrix}. \quad (14)$$

For waves $\beta \neq 0$ and $m \neq 0$, the 4×4 matrices may still be decoupled into two independent waves, but the decoupling is more involved. The following discussion uses TE waves as an example, but its derivations apply to other waves as well. We use TE0 to denote the 0th azimuthal-order TE waves. If m is larger than zero, we use the notation, TEm, to refer to the wave that is TE wave in the central region; in other than the central rod region, a small portion of TM wave mixes with the TE wave.

Because the Hankel function $H_m^{(1)}$ is the complex conjugate of $H_m^{(2)}$, we can write the elements of matrix $Q_n$ for the mth azimuthal order TE waves as $$Q_n = \begin{pmatrix} q_{n,11} & q_{n,12} \\ q_{n,21} & q_{n,22} \end{pmatrix} = \begin{pmatrix} |q_{n,11}|e^{i\psi_{n,11}} & |q_{n,12}|e^{i\psi_{n,12}} \\ |q_{n,12}|e^{-i\psi_{n,12}} & |q_{n,11}|e^{-i\psi_{n,11}} \end{pmatrix}. \quad (15)$$

The coefficients of the outgoing and incoming waves are $$\begin{pmatrix} h_{n+1}^{(1)} \\ h_{n+1}^{(1)} \end{pmatrix} = Q_n \begin{pmatrix} h_1^{(1)} \\ h_1^{(2)} \end{pmatrix} = \quad (16)$$

$$\begin{pmatrix} |q_{n,11}|e^{i\psi_{n,11}}h_1^{(1)} + |q_{n,12}|e^{i\psi_{n,12}}h_1^{(2)} \\ |q_{n,12}|e^{-i\psi_{n,12}}h_1^{(1)} + |q_{n,11}|e^{-i\psi_{n,11}}h_1^{(2)} \end{pmatrix}.$$

Then the field strength and intensity reflectivities of the multi-dielectric cylindrical layers can be calculated from these matrix elements, respectively, as $$r_n = -\frac{q_{n,21}}{q_{n,22}} = \left|\frac{q_{n,21}}{q_{n,22}}\right|e^{i(\psi_{11}-\psi_{12}+\pi)}, \text{ and } R_n = \left|\frac{q_{n,21}}{q_{n,22}}\right|^2. \quad (17)$$

We see that $\Delta\Psi = \Psi_{n,11} - \Psi_{n,12} + \pi$ represents the phase difference between the reflected and incident waves. It the comprises both the propagating phase change and the phase change at the interfaces. In the plane wave case, the phase change at an interface is very simple—either zero or 180 degree. But it is more complicated in the cylindrical wave case—it depends on both the refractive indices of the two media and the radius of the interface.

From Eq. (15), the phase difference can be calculated FROM $$\tan(\Delta\psi) = \frac{i(q_{12}q_{22} - q_{21}q_{11})}{q_{12}q_{22} + q_{21}q_{11}}. \quad (18)$$

So when $$q_{12}q_{22} - q_{21}q_{11} = 0, \quad (19)$$

the phase difference is an integer multiple of 180 degrees, and when $$q_{12}q_{22} + q_{21}q_{11} = 0, \quad (20)$$

the phase difference is an odd integer multiple of 90 degrees.

C. Cylindrical-Layer and Grating-Waveguide Distributed-Bragg Reflectors

When the phase difference $\Delta\Psi$ is an even number multiple of 180 degrees, the reflected incoming wave adds up constructively with the outgoing wave, and the cylindrical layers function as an outgoing wave reflector. On the other hand, when the phase difference is an odd integer multiple of 180 degrees, the reflected incoming wave adds up destructively with the outgoing wave, and the cylindrical layers function as an incoming wave reflector. Although there are other ways to determine whether the phase difference is an even or an odd multiple of 180 degree, we find the change in intensity $I_{n+1} - I_n$ a convenient indicator.

Based on the above discussion, we conclude the following design rules for multi-cylindrical-layer reflectors for mth azimuthal order cylindrical waves, as well as their guided wave versions. The more precise "grating steps" for guided wave versions are enclosed in parentheses, while the term "layer interfaces" more suitably describes multi-cylindrical-layer structures.

1) Outgoing cylindrical wave reflector: select cylindrical layer interfaces (or grating steps) at . . . , $r_i$, . . . so that (a) . . . , $Q_i$, . . . satisfy Eq. (19), and (b) . . . $I_i > I_{i+1}$, . . .

2) Incoming cylindrical wave reflector: select cylindrical layer interfaces (or grating steps) at . . . , $r_i$, . . . so that (a) . . . , $Q_i$, . . . satisfy Eq. (19), and (b) . . . $I_i < I_{i+1}$, . . .

3) Layer spacings (or grating steps) for higher order structures (of larger spacings) are determined by skipping intermediate zeroes of Eq. (19).

Unlike the case of one-dimensional DBRs, the designs for incoming-wave and outgoing-wave cylindrical reflectors follow different rules and, furthermore, the position of the innermost interface (step) is critical. This is because the incoming cylindrical waves emerge as the outgoing waves at $r = r_0 = 0$. This is one of the major differences between DBRs for cylindrical waves and for plane waves.

Multi-cylindrical-layer DBR structures taking the shape of that in FIG. 1 may be used for high-reflection coatings over rod-shaped optical components and devices. The cylindrical layers can be $SiO_2$, $Si_3N_4$ and $Al_2O_3$, for example. The layer deposition techniques are well known to the industry. The textbook by M. Born teaches some of the techniques. However, the layer spacing designs in prior textbooks are not adequate for cylindrical-wave structures.

The reflectors can also be used to construct laser resonators or flexible long-distance transmission lines (optical fibers). As an example, FIG. 3(a) and (b) compare the results of two resonators that have the same layer structures but different layer-spacing designs. They both have six cylindrical layers with a ratio of the alternating refractive indices $N_1/N_2 = \frac{1}{2}$. The last layer extends to infinity.

Figure 3A:
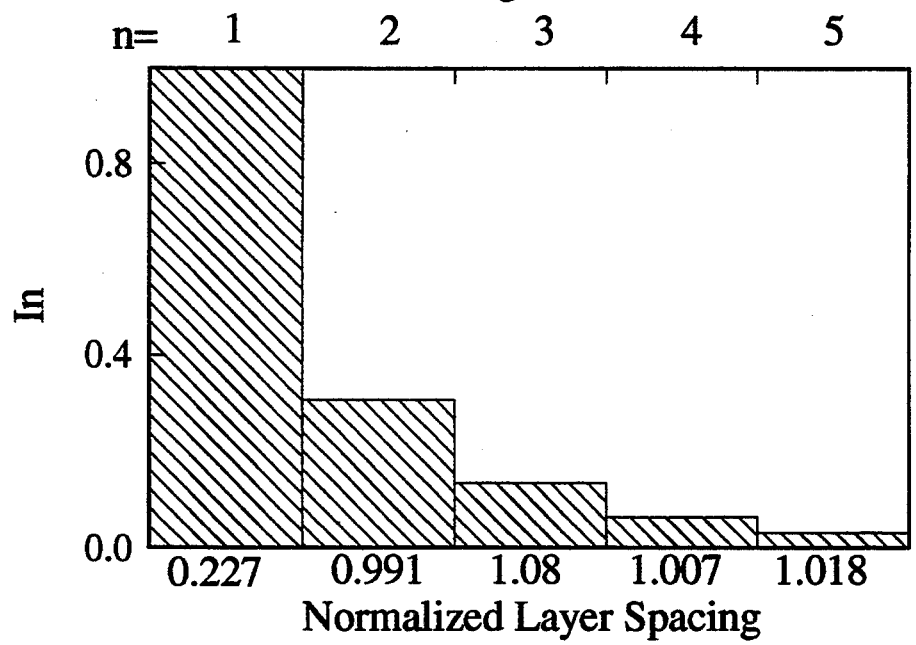
FIG. 3(a) and (b) shows the normalized wave intensities at the designated wavelength in each layer for two multi-cylindrical-layer structures. (a) is for the structure designed according to our invented design rules. (b) is for the quarter-wavelength-spaced structure designed according to the periodic phase change argument. The ratio of cylindrical-layer spacing to a quarter wavelength for each layer is shown at the bottom of each bar chart.

FIG. 3(a) shows the normalized intensity in the resonator with a first order outgoing-wave reflector for the TE0 wave designed according to the rules outlined above. Here TE0 refers to the zeroth azimuthal order TE waves. This figure is a bar chart showing the normalized intensity in, from left to right, layer (rod) $n = 1,2,3,4$ and 5 for the TE0 wave at the designated radial wavelength $\lambda_r$. The wave intensity decreases by a factor roughly equal to $N_1/N_2$ it every interface. The intensity is indeed concentrated in the central layers.

The ratio of the layer spacing to a quarter radial wavelength $\lambda_r/4$ for each layer (normalized spacing) is shown at the bottom of the bar chart. We can see that the layers are spaced neither at multiples of a quarter wavelength nor at the roots of Bessel functions.

Figure 3B:
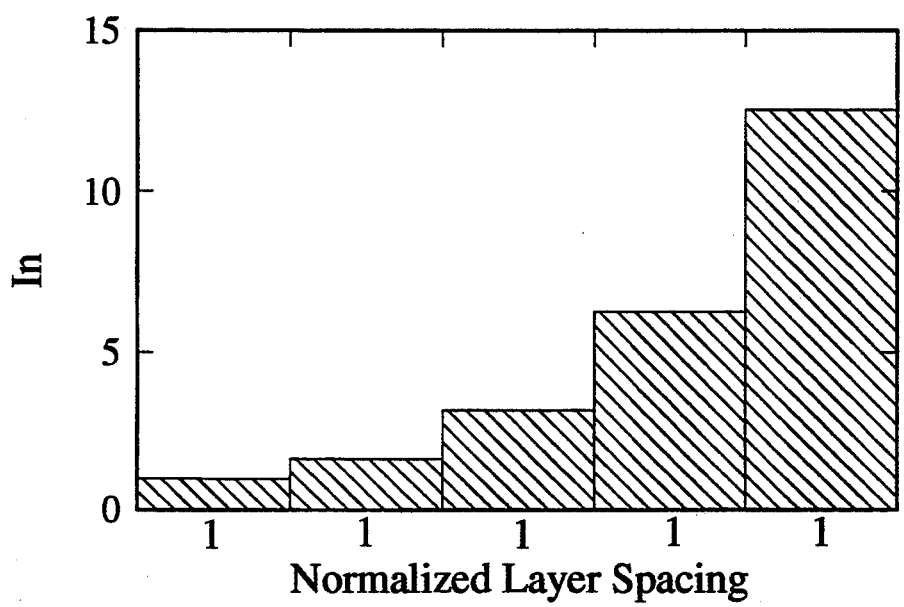

In contrast, FIG. 3(b) shows the intensity in the resonator with layer spacings that equal to a quarter radial wavelength $\lambda_r/4$. According to the theory of quarter-wavelength design, such a structure should be a resonator that concentrates waves in the central region. However, the TE0 wave intensity increases from the innermost layer (rod) to the outer layers; and it is not concentrated in the inner layers.

Guided-wave reflectors may be combined with other elements to design complicated guided-wave devices as described below. Many changes, modifications, variations and other uses and applications of these reflector structures will become apparent to those skilled in the art.

D. Low-Threshold-Current Vertical-Cavity Surface-Emitting Lasers

Figure 4:
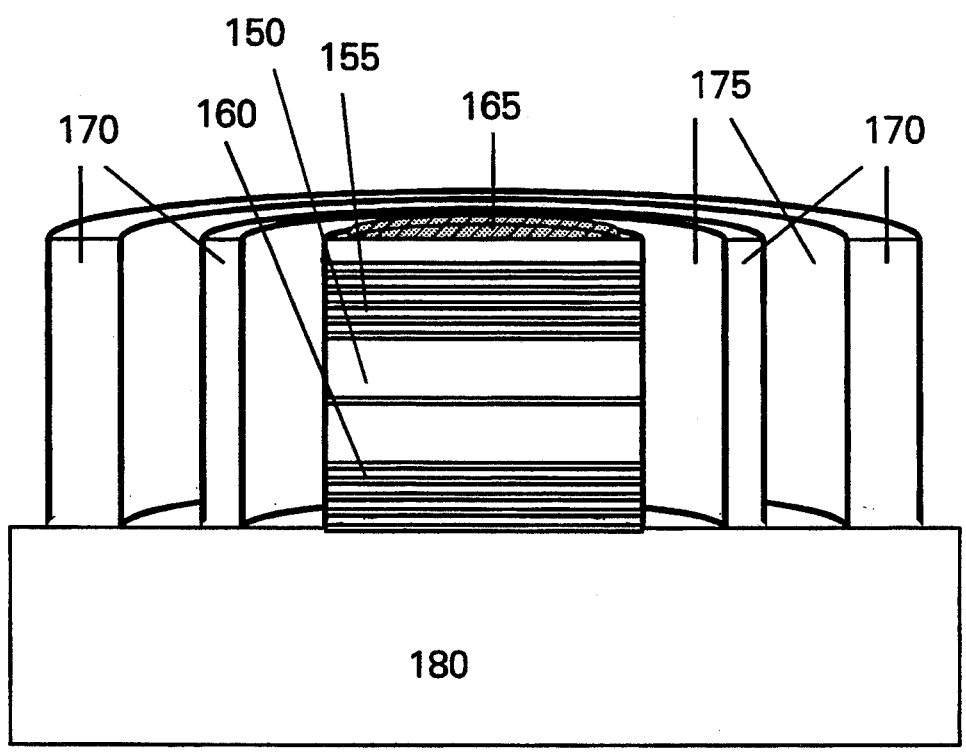
FIG. 4 is a partly cross-sectional and partly representational diagram of a vertical-cavity surface-emitting laser with an etched ridge-groove reflector for threshold reduction.

Outgoing-wave reflectors can be used in vertical-cavity surface-emitting lasers (VCSELs) to reflect waves back to the central region. FIG. 4 shows such a design. The central region containing 150, 155 and 160 is a VCSEL of industrial standard design. Regions 155 and 160 are one-dimensional quarter-wavelength multi-stack reflectors. Region 150 is the active region, which can be a standard InGaAs/GaAs or InGaAs/InGaAsP quantum-well structure.

In our design, cylindrical layers 170 are added. They can be Constructed of the same material as the central region or of some transparent material such as $SiO_2$. The deep grooves 175 are fabricated by the same etching techniques that fabricate the standard VCSELs. The grooves may be exposed to air or filled with material of refractive index different from that of the ridges. The spacings are determined by the rules outlined above. The alternating 170 and 175 structure forms an outgoing-wave reflector and concentrates the light wave in the central region. Such a structure can greatly reduce the threshold current of a VCSEL.

E. Anti-Reflection Cylindrical-Layer Coatings

Anti-reflection layer coatings are used to reduce reflection at media interfaces such as surfaces of lenses used in cameras and windows of lasers. The coating reduces the outgoing waves' reflection so that maximum light is radiated to the outside medium.

The coating techniques are standard in the optics industry. However, all the layer thickness design principles are based on the plane wave argument. Our invention improves the design of the layer thicknesses for anti-reflection cylindrical-layer coatings based on our cylindrical wave analysis. Our improved design is particular important for coatings over a small size cylindrical-wave device, such as a small rod-shape light source which radiates light of radial wavelength $\lambda_r$ to the outside medium, air.

First, if only one extra layer is coated, interfaces $r_1$ and $r_2$ are selected at the minimum of $R_1$ in Eq. (16). Second, if more than one layer is coated, the structure is difficult to analyze and the following principle may be adopted: arrange the layer spacings so that the reflected waves are 180 degrees out of phase at one interface but in phase at the next one so that the total reflection is canceled. We may re-write the above principle in the form of the design rule below.

1) Anti-reflective multi-cylindrical-layer structure: select cylindrical layer interfaces at . . . , $r_i$, . . . so that (a) . . . , $Q_i$, . . . satisfy Eq. (19), and (b) . . . $(-1)^i(I_i - I_{i+1}) > 0$, . . .

2) Higher order structures are constructed by skipping intermediate zeroes of Eq. (19).

Figure 5:
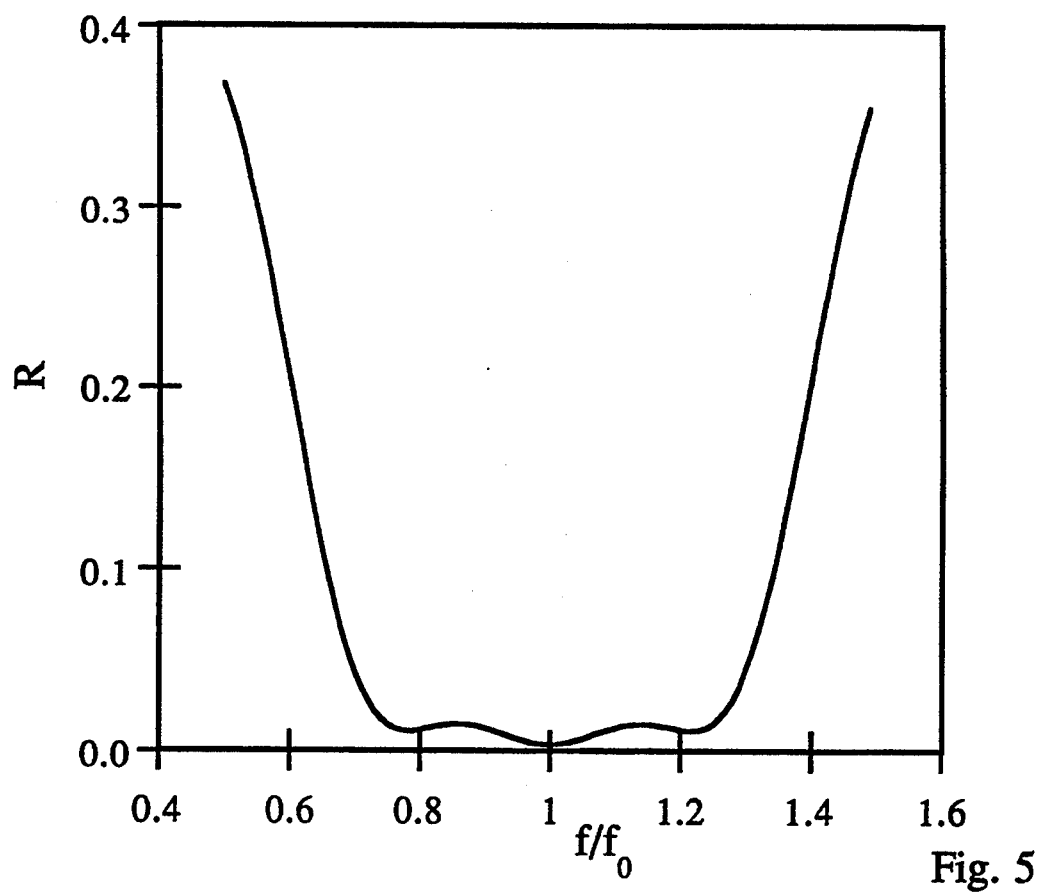
FIG. 5 shows the outgoing wave reflectivity of a three-cylindrical-layer anti-reflection coating structure.

FIG. 5 shows the reflectivity spectrum of a three-layer anti-reflection coating over a rod with a refractive index of 2. The refractive index is 1.5 for the first and third coating layers, and 2.5 for the second. Air (or vacuum) with a refractive index of 1 is the outermost medium. As designed, $r_1 = 2.312\lambda_{r0}$, $r_2 = 2.572\lambda_{r0}$, $r_3 = 2.845\lambda_{r0}$, $r_4 = 3.012\lambda_{r0}$. A minimum reflectivity of 0.1% is achieved at the designated center frequency $f_0$. Such an anti-reflection coating may be used over a small-radius rod-shaped light source, light receiver or fiber sensor. Again, the central rod radius is critical for such a cylindrical wave coating.

F. Grating Waveguide Cylindrical Wave Couplers

Figure 6:
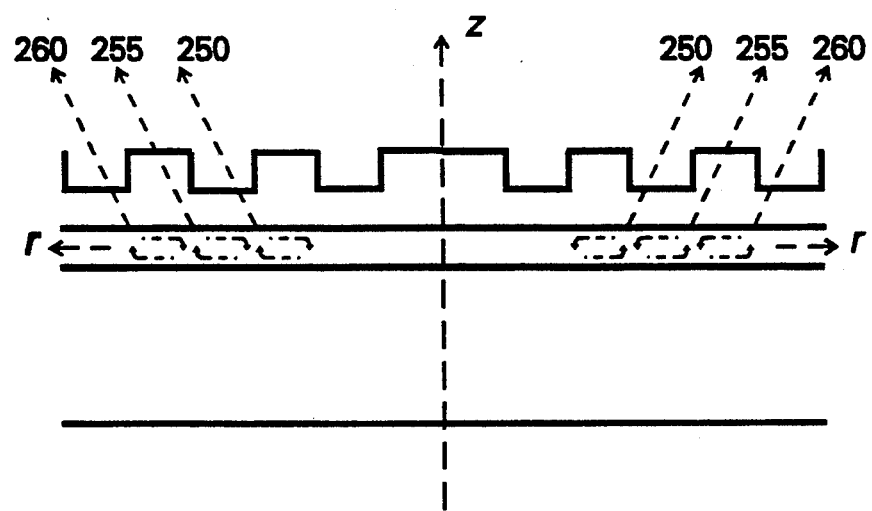
FIG. 6 is a cross-section of a section of a grating directional coupler depicting the wave diffractions at the ridge-groove interfaces.

A grating in a waveguide may be used as a coupler to redirect a portion of the guided waves out for output. Because optical waves can be reversed, a wave coupler can also be used in the reverse direction—to couple waves shining on the grating into the :Waveguide. FIG. 6 shows the cross-section of a section of such a grating coupler.

According to wave diffraction theory, the grating steps diffract waves in all directions. If the grating spacings are designed so that all the diffracted waves (250, 255 and 260 in FIG. 6), which are at the same angle $\theta$ to the r direction, are in phase, the combined waves add up constructively and become the net diffracted wave.

The phase of a diffracted wave can be determined by the phase of the reflected wave given in Eq. (18). However, we should keep in mind that a diffracted have with a diffraction angle $\theta$ larger than 90 degrees picks up a 180-degree phase shift at an interface from a low-refractive-index medium to high-refractive-index medium, and we should take this extra phase change into account.

As an example, we may summarize the design rule for a 90-degree coupler as follows:

1) 90-degree wave coupler: select grating steps at . . . , $r_i$, . . . so that (a) . . . $Q_i$, . . . satisfy Eq. (19 ), and (b) $I_i > I_{i+1}$ if $u_i > u_{i+1}$ and $I_i < I_{i+1}$ if $u_i < u_{i+1}$.

2) Higher-order structures are constructed by skipping intermediate zeroes of Eq. (19). 90-degree couplers will be used in the design of the surface-emitting lasers described below. Many changes, modifications, variations and other uses and applications of these coupler structures will become apparent to those skilled in the art.

G. Distributed-Feedback Structures

When the phase difference at each interface for a structure in FIG. 1 or 2 is an odd-number multiple of 90 degrees, the reflections of the incoming and outgoing waves are equal, and the waves experience "distributed feedback" (DFB). The one-dimensional guided-wave versions of such structures with periodic gratings are used in DFB semiconductor lasers to achieve spectral purity.

In general, there are two dominating lasing frequencies in a index-coupled DFB structure in which the grating-induced changes in the complex effective index are a real number; the spectral purity of a DFB laser is not as good as a DBR laser. On the other hand, a DFB laser is superior if it is gain coupled in which the grating-induced changes in the complex effective index are a complex number. A quarter-wavelength-shifted DFB structure, though called DFB, is actually composed of two DBRs.

The above comparison between DFB and DBR structures extends to their cylindrical-wave counterparts. A circular DFB structure may be used in a concentric-circular grating DFB laser as demonstrated by T. Erdogan et al. However, the layer (grating-step) spacings should not be periodic. We summarize the design rule for a DFB structure as follow:

Distributed-feedback structure: select cylindrical layer interfaces (or grating steps) at . . . , $r_i$, . . . so that . . . , $Q_i$, . . . satisfy Eq. (20). Higher order structures are constructed by skipping intermediate zeroes of Eq. (20).

H. Narrow-Linewidth Semiconductor Lasers

Figure 7:
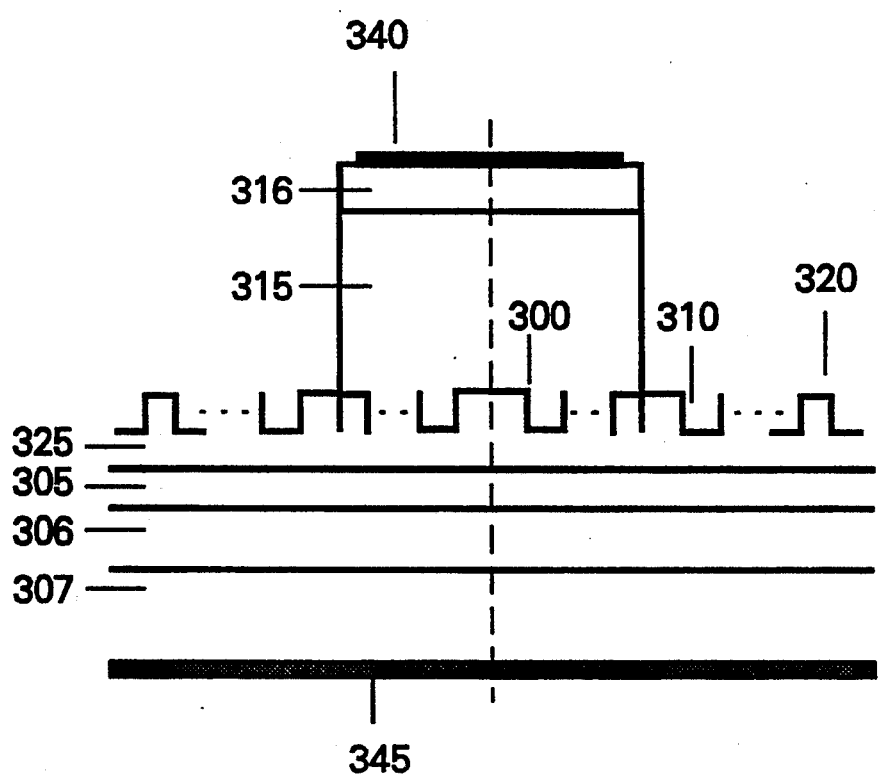
FIG. 7 is a cross-section of a narrow-linewidth surface-emitting distributed-feedback semiconductor laser.

FIG. 7 shows a cross-section of the design for a circular narrow-linewidth surface-emitting semiconductor laser. It combines the design of a grating outgoing-wave reflector with that of a grating 90-degree coupler.

Region 300 is the gain waveguide region with a circular outgoing-wave DBR grating in cladding layer 325. The grating is third order (skipping one root of Eq. (19) when determining the step locations), consisting of 50 ridge-groove pairs. Region 310 is a grating 90-degree coupler with 50 ridge-groove pairs to couple laser light for output. Region 320 is a 100-pair outgoing-wave DBR grating, which reflects outgoing light waves back to the gain region. The electrodes, 340 and 345 respectively, on the top and bottom are for electrical current injection into the gain region. The additional cladding layer 315 in the gain region should be think enough, at least twice of the wavelength of the lasing wave, to avoid the metal contact 340 interfering with the guided wave.

Except for the circular grating designs, the slab layer designs follow industrial standard. The manufacturing techniques for semiconductor lasers are well established in the industry as described in Ref. [2] and [3]. For example, semiconductor layers can be grown by industrial standard techniques such as molecular-beam epitaxy (MBE) and organic-metal chemical-vapor deposition (OMCVD). Grating patterns can be defined by electron-beam lithography, and the grating grooves can be etched by ion-beam etching techniques.

As a sample design for the structure in FIG. 7, the active slab layer 305 is an $In_{0.25}Ga_{0.75}As/GaAs$ quantum-well structure consisting a 0.008-$\mu$m thick $In_{0.25}Ga_{0.75}As$ Well sandwiched in the center of a 0.15-$\mu$m thick GaAs. It emits light at 0.98 $\mu$m wavelength. The bottom cladding 306 is 1.5-$\mu$m thick n-type $Al_{0.3}Ga_{0.7}As$. The substrate 307 is n-type GaAs. The layer with grating 325 is 0.49-$\mu$m thick p-type $Al_{0.3}Ga_{0.7}As$. The layer above that, 315, is a 1.5-$\mu$m thick p-type $Al_{0.6}Ga_{0.4}As$. Layer 316 is a p-type GaAs contact layer.

Electrodes 340 and 345 are, respectively, Zn—Cr—Au and Ge—Ni—Au alloys.

The etched grating-groove depth 300, 310 and 320 in layer 325 is 0.34 $\mu$m, a full wavelength in $Al_{0.3}Ga_{0.7}As$. This grating depth is critical for the reflected waves at the $Al_{0.3}Ga_{0.7}As$-air interfaces in the 310 portion to add up constructively.

Figure 8A:
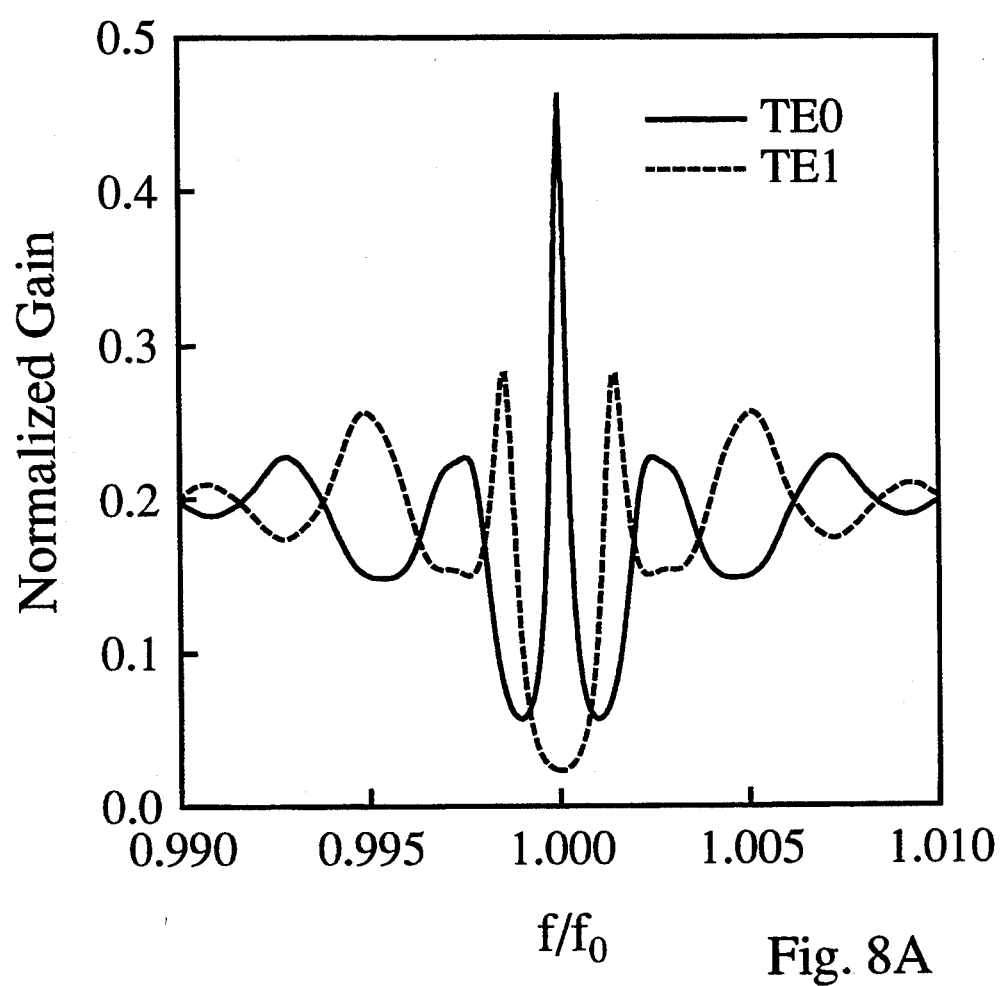
FIG. 8A shows the normalized TE0 and TE1 wave gain spectra of a narrow-linewidth surface-emitting distributed-feedback semiconductor laser shown in FIG. 7 with grating-step spacings designed for TE0 wave lasing.

If the grating reflector and coupler have grating-step spacings selected for TE0 wave, the structure favors TE0 wave. FIG. 8A shows the calculated normalized gain spectra for the TE0 and TE1 waves versus normalized optical frequency, $f/f_0$, where $f_0$ is the designated TE0 wave lasing frequency corresponding to 0.98 $\mu$m wavelength. Here TE0 refers to the zeroth azimuthal order TE wave: and TE1 refers to the wave which is first order TE wave in the central ridge (or groove) although $E_z$ is not zero in the other part of the waveguide. The structure favors lasing at the isolated peak of the TE0-wave gain. The isolation provides good side-mode suppression. The TE1 wave gain has a minimum at the designated lasing frequency; therefore, modes other than the zeroth order azimuthal mode are suppressed to the maximum.

Figure 8B:
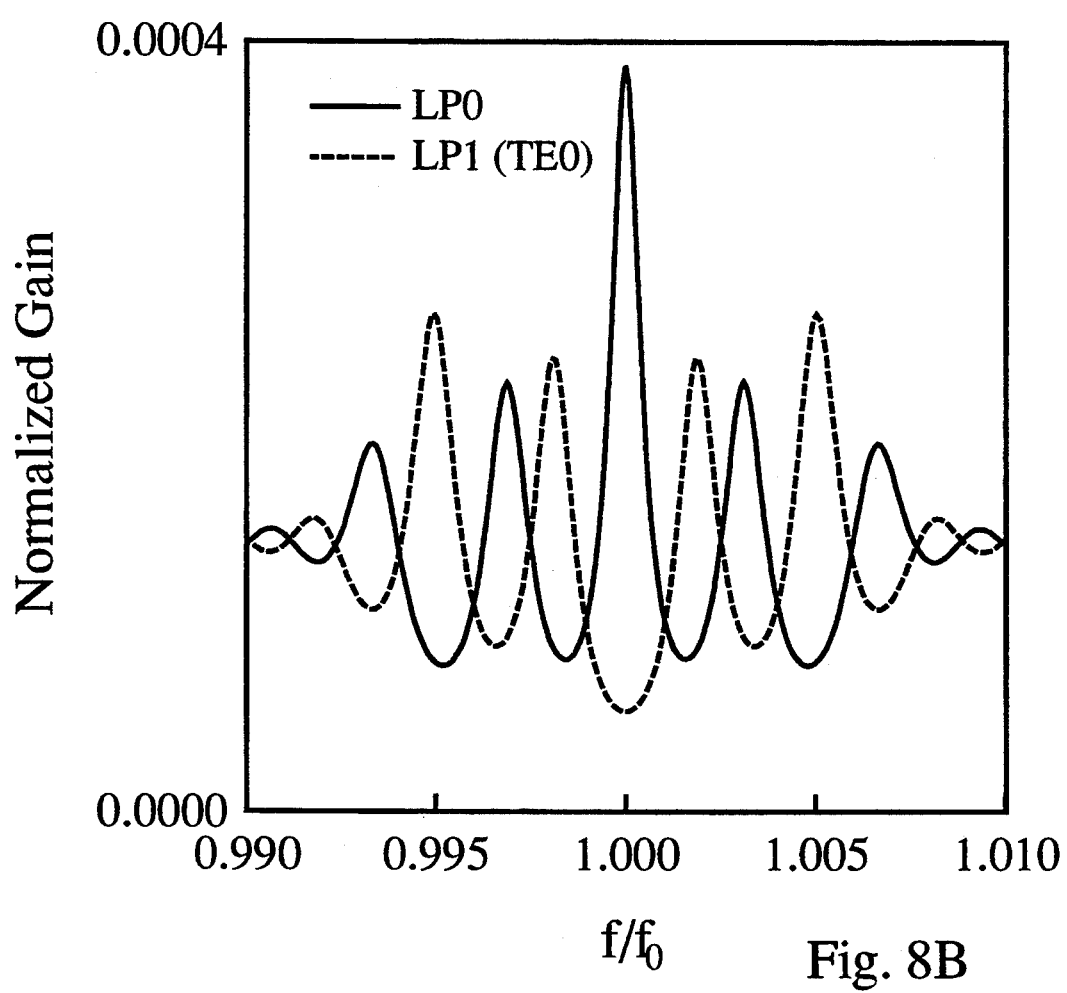
FIG. 8B shows the normalized LP0 and TE0 wave gain spectra of a narrow-linewidth surface-emitting distributed-feedback semiconductor laser shown in FIG. 7 with grating-step spacings designed for LP0 wave lasing.

The optical power distribution of a TE0 wave is azimuthally uniform. It is the optimal wave pattern for many applications. But it is not the optimal one for optical-fiber coupling. The fundamental wave of an optical fiber is LP0 wave, which is a mixture of waves of azimuthal mode number m=1 and m=−1. We can select the grating-step spacings to favor LP0 wave lasing. FIG. 8B shows the calculated normalized gain spectra for the LP0 and TE0 waves versus normalized optical frequency, $f/f_0$. TE0 wave has wave pattern compatible with the LP1 wave in an optical fiber.

The outside reflector in region 320 may not be used if the DBR grating in region 300 alone provide enough wavelength (frequency) discrimination and achieves desired narrow linewidth. Another modified design may attach a cladding layer and an electrode on top of the outside reflector grating so that the index may be altered by current injection through the electrode for the purpose of wavelength tuning.

I. Surface-emitting Semiconductor Lasers for High-power Applications

Figure 9:
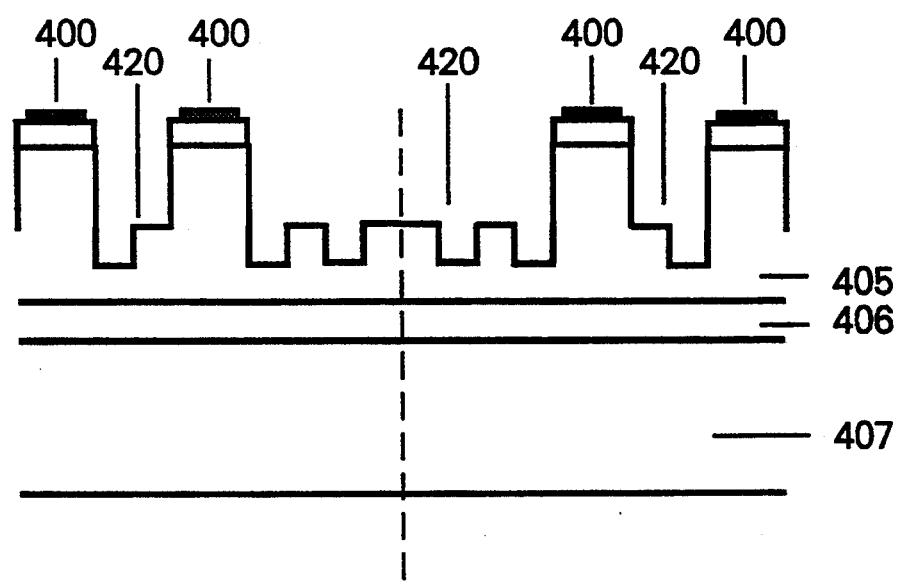
FIG. 9 is the cross-section of a broad-area high-power surface-emitting semiconductor laser.

If an active slab layer, such as an InGaAs/GaAs quantum well described above, is added in the waveguide of the 90-degree coupler described above and a means of pumping the active region provided, the structure is a surface-emitting laser. The pumping scheme can be optical or electric, but electric pumping is more useful. FIG. 9 shows a surface-emitting semiconductor laser with several electric-pumping and emitting sections. A simpler version of such a laser can have only one electric-pumping section and is useful for low-power applications, such as on chip laser for optical interconnections. But a multi-pumping-section laser is useful for high-optical-power applications.

Narrow-emitting-area semiconductor lasers cannot operate at high power because of optical damage to semiconductor material. On the other hand, broad-emitting-area lasers tend to have skewed spectral purity and light-output patterns. A solution is to use wave-frequency and wave-pattern control elements in broad-area semiconductor lasers.

Grating waveguide reflectors and couplers are wave-frequency and wave-pattern control elements and can be used in broad-area lasers to achieve high-power lasing. As a sample design, a cross-section of a surface-emitting semiconductor laser with gain regions and 90-degree couplers is shown in FIG. 9.

Regions 400 are gain regions. It should be wide enough so that metal contact can be deposited on the top for current injection. The cladding layer in the gain regions should be think enough to avoid interference of the metal contact with the guided waves. Regions 420 are 90-degree wave couplers. One combination of gain-region and coupler provide low power output and may suit some applications. However, more such combinations of gain and coupler regions should be added to increase for high power.

The output area of this laser is much larger than that of an edge-emitting laser, and the power per area is lower; therefore, optical power per area can be kept well below the level that damaging to the material occurs. Furthermore, since the optical intensity decreases with increasing r roughly with a factor of $1/r^2$. Placing gain sections away from the center—the region with highest intensity—reduces the filamentation effect as well.

The grating spacings of the coupler, including the widths of the gain regions, are determined by the design rules outlined for couplers.

The grating 90-degree couplers not only redirect the light waves for output but also function as frequency-selection elements. They provide one part of the optical feedback at the ridge-groove interfaces for laser oscillation; the semiconductor-air interfaces provide another part. Again, we should design the depths of the grooves of the grating to be a whole wavelength in material 405 to ensure that the light waves reflected from the surfaces of the ridges and grooves add up constructively.

What is claimed is:

1. An apparatus for controlling guided cylindrical waves comprising a disk-like waveguide, in which a guided cylindrical wave at a wavelength can propagate, said waveguide consisting of at least one disk-like wave-transmitting thin film, whose thickness varies such that a plurality of concentric-circle ridges and grooves is formed on one surface of said thin film, whereby said ridges and grooves have a plurality of circular interfaces, said ridges and grooves and said interfaces are around a center axis, said guided cylindrical wave propagating in said waveguide, due to the thickness variation in said thin film, having different radial wavevectors on two sides of each of said interfaces, said guided cylindrical wave being partially reflected by said interfaces, being partially transmitted across said interfaces and being partially diffracted away from said thin film by said interfaces due to the radial wavevector differences the intensities and phases of the reflected waves, the transmitted waves and the diffracted waves due to said interfaces being controlled by a sequence of phase changes, $\Delta\psi_n$, $n=1, 2, \ldots, M$, where M is a total number of said interfaces.

said phase changes being calculated by the following equation, $$\tan(\Delta\psi_n) = \frac{i(q_{n,12}q_{n,22} - q_{n,21}q_{n,11})}{q_{n,12}q_{n,22} + q_{n,21}q_{n,11}}$$

where $q_{n,11}$, $q_{n,12}$, $q_{n,21}$, and $q_{n,22}$ are complex quantities and are calculated by the following matrix equation and initial condition $$\begin{pmatrix} q_{n,11} & q_{n,12} \\ q_{n,21} & q_{n,22} \end{pmatrix} =$$

$$\begin{pmatrix} H_m^{(1)}(u_{n+1}r_n) & H_m^{(2)}(u_{n+1}r_n) \\ \frac{1}{u_{n+1}^2} \frac{dH_m^{(1)}(u_{n+1}r_n)}{dr} & \frac{1}{u_{n+1}^2} \frac{dH_m^{(2)}(u_{n+1}r_n)}{dr} \end{pmatrix}^{-1}$$

$$\begin{pmatrix} H_m^{(1)}(u_n r_n) & H_m^{(2)}(u_n r_n) \\ \frac{1}{u_n^2} \frac{dH_m^{(1)}(u_n r_n)}{dr} & \frac{1}{u_n^2} \frac{dH_m^{(2)}(u_n r_n)}{dr} \end{pmatrix}$$

$$\begin{pmatrix} q_{n-1,11} & q_{n-1,12} \\ q_{n-1,21} & q_{n-1,22} \end{pmatrix}$$

$$\begin{pmatrix} q_{0,11} & q_{0,12} \\ q_{0,21} & q_{0,22} \end{pmatrix} = \begin{pmatrix} 1 & 0 \\ 0 & 1 \end{pmatrix}$$

where m is an integer, $H_m^{(1)}$ and $H_m^{(2)}$ are mth order Hankel functions of the first and second kind respectively.

$r_n$ is a radius of an nth circular interface of said circular interfaces from said center axis, and $u_n$ and $u_{n+1}$ are the radial wavevectors of said guided cylindrical wave immediately inside said nth circular interface and immediate outside said nth circular interface respectively.

2. A guided-cylindrical-wave controlling apparatus defined in claim 1 with said guided cylindrical wave being an outgoing wave, which propagates away from said center axis, said phase changes being even-integer multiples of $\pi$, whereby a combination of the reflected waves is maximized, whereby the apparatus functions as a waveguide outgoing-cylindrical-wave reflector.

3. A guided-cylindrical-wave controlling apparatus defined in claim 1, with said guided cylindrical wave being an incoming wave, which propagates toward said center axis, said phase changes being odd-integer multiples of $\pi$, whereby a combination of the reflected waves is maximized, whereby the apparatus functions as a waveguide incoming-cylindrical-wave reflector.

4. A guided-cylindrical-wave controlling apparatus defined in claim 1, said phase changes being odd-integer multiples of $\pi/2$.

5. A guided-cylindrical-wave controlling apparatus defined in claim 1, having said phase changes chosen such that a combination of the diffracted waves propagating at an angle to said center axis is maximized, whereby the apparatus couples said guided cylindrical wave out of said waveguide at said angle and functions as a waveguide cylindrical-wave directional coupler.

6. A guided-cylindrical-wave controlling apparatus defined in claim 5, said phase changes being integer multiples of $\pi$, and $\Delta\psi_{n+2} - \Delta\psi_n$ being an even-integer multiple of $\pi$, where $n = 1, 2, \ldots, M-2$, whereby a combination of the diffracted waves propagating parallel to said center axis is maximized, whereby the apparatus functions as a waveguide ninety-degree cylindrical-wave coupler.

7. A guided-cylindrical-wave controlling apparatus defined in claim 6, with heights of said ridges being integer multiples of said wavelength of said guided cylindrical wave, whereby the diffracted waves propagating through said ridges and grooves are in phase.

8. A guided-cylindrical-wave controlling apparatus define in claim 6 or 7, further comprising at least one thin film of optical-wave-generating active material in said waveguide, at least one of said ridges being substantially wide and tall and having additional means of injecting electric current into said thin film of optical-wave-generating active material to generate said guided cylindrical wave, whereby the apparatus functions as a surface-emitting light-generating device.

9. A guided-cylindrical-wave controlling apparatus defined in claim 8, comprising a plurality of the substantially wide and tall ridges, whereby a total power of the generated wave by said active material is substantially high.

10. A guided-cylindrical-wave controlling apparatus defined in claim 9, the wide and tall ridges are substantially distant from said center axis, thereby being substantially distant from where the intensity of the generated wave is substantially high, whereby the apparatus can prevent the wave-generation being altered by the high wave intensity near said center axis.

11. A guided-cylindrical-wave controlling apparatus defined in claim 8, at least one of the substantially tall and wide ridge further comprising a waveguide outgoing-cylindrical-wave reflector, whereby the apparatus functions as a narrow-linewidth light-generating device.

12. A guided-cylindrical-wave controlling apparatus defined in claim 11, said electric current being variable so that said wavelength can be changed to a desired value, whereby wavelength tuning is achieved in this apparatus.

* * * * *